United States Patent [19]

Nakata et al.

[11] Patent Number: 5,081,484
[45] Date of Patent: Jan. 14, 1992

[54] IMAGE RECORDING MEDIUM AND DETECTING DEVICE THEREFOR

[75] Inventors: Takashi Nakata; Shunichi Higashiyama, both of Nagoya; Takashi Tomizawa, Aichi; Satoru Kuwabara, Nagoya; Jun Sakai, Nagoya; Mitsuru Ohta, Nagoya; Hiroshi Kawahara, Nishikasugai; Keiko Suzuki, Okazaki, all of Japan

[73] Assignee: Brother Kogyo Kabushiki Kaisha, Nagoya, Japan

[21] Appl. No.: 555,293

[22] Filed: Jul. 19, 1990

Related U.S. Application Data

[62] Division of Ser. No. 269,641, Nov. 10, 1988, abandoned.

[30] Foreign Application Priority Data

Mar. 1, 1987 [JP] Japan ................................. 63-47927
Nov. 13, 1987 [JP] Japan ................................. 62-173929
Apr. 6, 1988 [JP] Japan ................................. 63-46709

[51] Int. Cl.$^5$ ........................ G03B 27/32; G03B 27/52
[52] U.S. Cl. ........................................ 355/27; 250/561; 355/68
[58] Field of Search .................... 355/27, 40, 41, 68, 355/77, 133; 250/560, 561; 356/445, 429

[56] References Cited

U.S. PATENT DOCUMENTS 4,782,365 11/1988 Takagi ............................ 355/68 X
4,845,374 7/1989 White et al. ..................... 250/561 X
4,919,531 4/1990 Mashiko et al. ..................... 355/27

Primary Examiner—Richard A. Wintercorn
Attorney, Agent, or Firm—Kane, Dalsimer, Sullivan, Kurucz, Levy, Eisele and Richard

[57] ABSTRACT

An image recording medium is provided with an identifying index indicative of whether or not one side of the image recording medium is a front side coated with developing agent. In another image recording medium coated with developing agent, electrical resistance material is coated on at least one side of the image recording medium. In a detecting device for the another image recording medium, an electrode unit is provided for measuring electric conductivity of one side of the image recording medium. A control unit is connected to the electrode unit for identifying the image recording medium on the basis of the electric conductivity measured by the electrode unit. In another detecting device, a light emitting unit emits light with which at least one of front and back sides of an image recording medium is illuminated. A light receiving unit receives light reflected from the at least one side of the image recording medium. An identifying unit is connected to the light receiving unit for identifying the front and back sides and presence and absence of the image recording medium on the basis of the light received by the light receiving unit.

7 Claims, 7 Drawing Sheets

IMAGE RECORDING MEDIUM AND DETECTING DEVICE THEREFOR

This is a division of copending application Ser. No. 269,641, filed Nov. 10, 1988 now abandoned.

BACKGROUND OF THE INVENTION

This invention relates generally to image recording apparatuses such as a printer, a copying machine and so on, and more particularly, to an image recording medium such as, for example, a developing sheet, a photosensitive sheet, a heat-sensitive sheet or the like for use with the image recording apparatuses and also to a detecting device for the image recording medium.

Image recording medium material is known from Japanese Patent Application Laid-Open Nos. 58-88739, 58-88740, 61-42649, 61-24495 and the like. The known image recording medium material consists of a combination of two types of recording media. One type is a recording medium coated with microcapsules which contain chiefly photo-curable material, photo-polymerization initiator and dye precursor. The other type is a image recording medium coated with developing agent which reacts with the dye precursor contained in the microcapsules, to develop color.

In the image recording medium material of the kind referred to above, the microcapsules containing the photo-curable material are cured selectively by light, and the cured microcapsules increase in mechanical strength. The image recording medium material is used with an image recording apparatus in such a manner that the recording medium coated with the microcapsules is exposed to light in accordance with image information, and the microcapsules not cured by the exposure are destroyed to cause the dye precursor contained in the uncured microcapsules to react with the developing agent coated with the image recording medium, thereby recording an image onto the image recording medium.

The image recording medium is composed of a white sheet-like carrier or substrate and white developing agent coated on the substrate. However, the image recording medium has no identifying index indicative of whether or not one side of the image recording medium is coated with the developing agent. It is very difficult for a user to identify the developing-agent-coated side of the image recording medium. When the image recording medium is used with the above-described image recording apparatus, there may often occur a case where the image recording medium is erroneously inserted in the apparatus with the developing-agent-coated side of the image recording medium facing incorrectly. It is of course that erroneous insertion of the image recording medium does not enable the image to be recorded onto the image recording medium.

Apart from the above, in general, the conventional image recording apparatus employs mechanical means such as microswitches or the like, in order to detect presence and absence of a sheet-like image recording medium such as a developing sheet, a heat-sensitive sheet or the like having front and back sides distinguishable from each other.

Further, the usual image recording apparatus is not provided with means for identifying the front and back sides of the image recording medium. When a user feeds the image recording medium into the apparatus, the user ascertains the front and back sides of the image recording medium with his eyes, and sets the image recording medium in the apparatus so as to face correctly or appropriately.

In connection with the above, a general or usual way of identifying the front and back sides of the image recording medium relies upon optical means, as disclosed in Japanese Patent Application Laid-Open Nos. 58-205572 and 57-70905.

It is desirable for the image recording apparatus, however, to have means for identifying the front and back sides of the image recording medium, in order to lighten the user's burden and to prevent errors in printing or development due to erroneous feeding of the image recording medium.

As discussed above, it is required for the conventional arrangement to have both the mechanical means and the optical means independently of each other in order to identify the presence and absence and the front and back sides of the image recording medium. This results in an increase in the cost.

SUMMARY OF THE INVENTION

It is therefore an object of this invention to provide an improved image recording medium whose front and back sides can easily be identified by a user.

It is another object of the invention to provide an improved detecting device capable of identifying an image recording medium without marring an appearance thereof.

It is still another object of the invention to provide an improved detecting device capable of identifying presence and absence and front and back sides of an image recording medium in an inexpensive manner.

For the above purpose, according to the invention, there is provided an image recording medium comprising a substrate and developing agent coated on one side of the substrate, wherein the image recording medium is provided with an identifying index indicative of whether or not one side of the image recording medium is a front side coated with the developing agent.

According to the invention, there is also provided an image recording medium coated on one side thereof with developing agent, wherein electrical resistance material is coated on at least one of opposite sides of the image recording medium.

According to the invention, there is also provided a detecting device for an image recording medium of type in which developing agent is coated on one side of the image recording medium, and electrical resistance material is coated on at least one of opposite sides of the image recording medium, which comprises:

electrode means for measuring electric conductivity of one of the opposite sides of the image recording medium; and control means connected to the electrode means for identifying the image recording medium on the basis of the electric conductivity measured by the electrode means.

According to the invention, there is also provided a detecting device for an image recording medium having front and back sides distinguishable from each other, which comprises:

light emitting means for emitting light with which at least one of the front and back sides of the image recording medium is illuminated;

light receiving means for receiving light reflected from the at least one side of the image recording medium; and control means connected to the light receiving means, for identifying the front and back sides and presence and absence of the image recording medium on the basis of the light received by the light receiving means.

DESCRIPTION OF THE EMBODIMENTS

Figure 1:
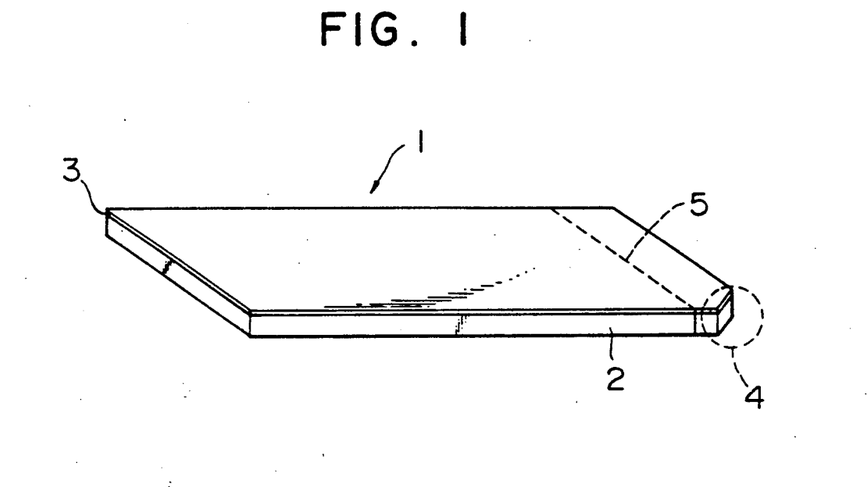
FIG. 1 is an exaggerated schematic perspective view of an image recording medium embodying the invention.

Referring first to FIG. 1, there is schematically shown, in an exaggerated manner, a sheet-like image recording medium 1 embodying the invention. The image recording medium 1 has a substrate 2 made of free paper whose thickness is 85 micrometers. Developing agent 3 is coated on one side of the substrate 2 in the following manner. That is, 50 parts of acid white clay, 30 parts of bisphenol A, and 30 parts of P-phenylphenol are dispersed in 60 parts of aqueous solution of polyvinyl alcohol that is binder. Subsequently, the developing dispersion solution is coated on one side of the substrate 2 by means of a #20 bar coater. The developing agent 3 coated on the substrate 2 is then dried at 90° C. Thus, the image recording medium 1 is completed. Subsequently, as shown in FIG. 1, a corner of an end edge portion of the image recording medium 1 is cut out at 4 to form an identifying index indicative of the front and back sides of the image recording medium 1. Perforation 5 is formed along the end edge portion of the image recording medium 1 including the cut-out 4 in order to enable the end edge portion of the image recording medium 1 to easily be severed from the remaining portion or a body thereof.

Figure 2:
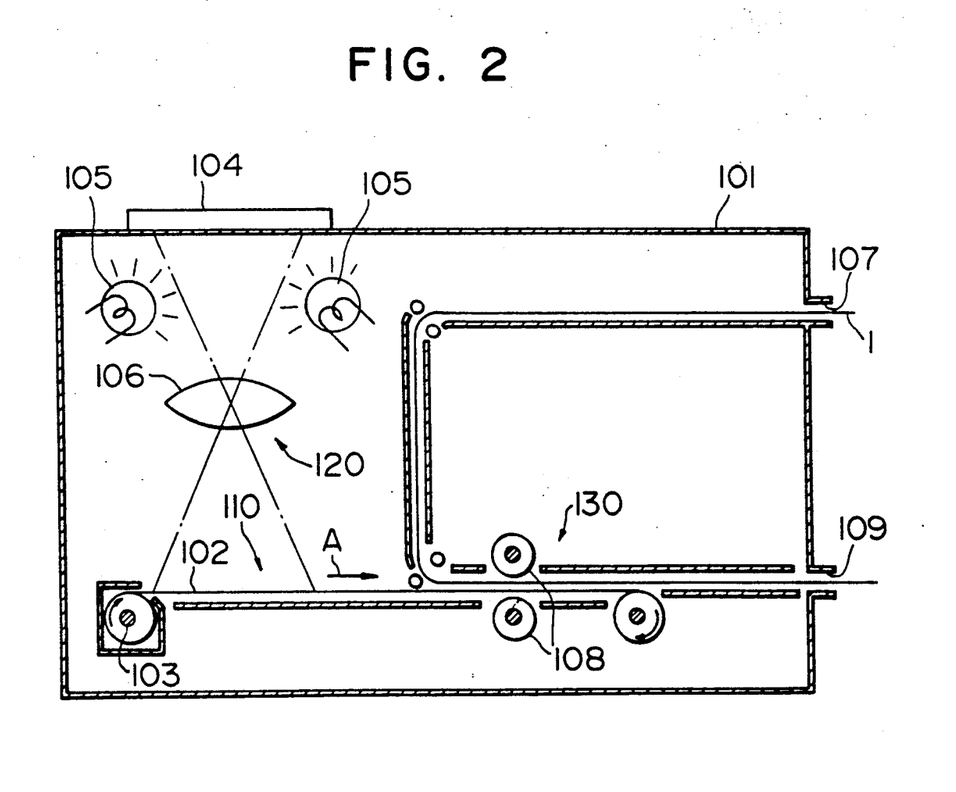
FIG. 2 is a schematic cross-sectional view of an image recording apparatus employing the image recording medium illustrated in FIG. 1.

FIG. 2 schematically shows an image recording apparatus of type which utilizes color-compatible photo and pressure sensitive recording medium material disclosed in U.S. Pat. No. 4,399,209. The recording medium material is composed of a recording medium in the form of a continuous web 102 and the sheet-like image recording medium 1 illustrated in FIG. 1. The continuous web 102 is coated with microcapsules each containing dye precursor.

The image recording apparatus comprises a body 101 within which the above-mentioned continuous web 102 is wound into a roll around a feed roller 103. A portion of the web 102 is wound off the feed roller 103 and is fed to an exposure station 110 in a direction indicated by an arrow A.

An exposure unit 120 is associated with the exposure station 110, and comprises a pair of light sources 105 and 105 emitting light with which an original 104 having carried thereon image information is illuminated. Light reflected from the original 104 passes through an optical lens system 106 and shines upon the portion of the web 102 at the exposure station 110. Thus, the portion of the web 102 is exposed to the light passing through the optical lens system 106 so that a latent image corresponding to the image information on the original 104 is formed onto the portion of the web 102.

The body 101 is formed in its side wall with an insertion opening 107 for the image recording medium 1. The image recording medium 1 inserted through the insertion opening 107 is superimposed upon the portion of the web 102 having carried thereon the latent image. The superimposed image recording medium and web 1 and 102 are fed to a developing station 130 at which a pair of pressure rollers 108 and 108 are arranged. The pressure rollers 108 and 108 cooperate with each other to pressurize the superimposed image recording medium and web 1 and 102 to develop the latent image on the portion of the web 102, onto the image recording medium 1. The image recording medium 1 having carried thereon the developed image is discharged out of the body 101 through a discharge opening 109 formed in the side wall of the body 101.

The operation of the image recording apparatus constructed as above will be described.

The light emitted from the light sources 105 and 105 and reflected from the original 104 passes through the optical lens system 106 and exposes a portion of the web 102 at the exposure station 110. Thus, a latent image corresponding to the image information on the original 104 is formed on the portion of the web 102.

A user then inserts the image recording medium 1 into the body 101 through the insertion opening 107 in such a manner that the cut-out 4 of the image recording medium 1 shown in FIG. 1 is located on the right and on this side as viewed in FIGS. 1 and 2. The inserted image recording medium 1 is superimposed upon the portion of the web 102 having been exposed to the light from the original 104. The superimposed image recording medium and web 1 and 102 are pressurized by the pressure rollers 108 and 108. By this processing, the dye precursor is squeezed out of the uncured microcapsules on the web 102 which are not exposed to the light, and is reacted with the developing agent 3 coated on the image recording medium 1, whereby an image corresponding to the latent image on the portion of the web 102 is formed on the image recording medium 1. The image recording medium 1 having carried thereon the image is discharged out of the body 101 through the discharge opening 109. Subsequently, if necessary, the end edge portion of the image recording medium 1, which is formed with the cut-out 4, may be severed from the body of the image recording medium 1 along the perforation 5.

The image recording medium 1 embodying the invention is produced and used in the manner described above.

Figure 3:
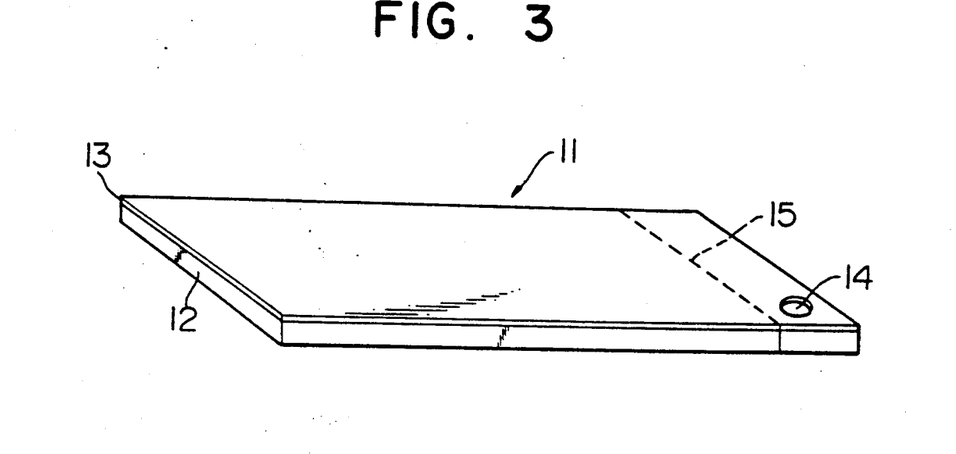
FIG. 3 is a view similar to FIG. 1, but showing a modified image recording medium.

Referring next to FIG. 3, there is shown a modified image recording medium 11 which is composed of a substrate 12 and developing agent 13 coated on one side of the substrate 12. The image recording medium 11 is formed at its corner with a through bore 14 serving as an identifying index. An end edge portion of the image recording medium 11 formed with the through bore 14 can be severed from the body of the image recording medium 11 along perforation 15. The position of the through bore 14 enables a user to identify the front side of the image recording medium 1 coated with the developing agent 13. Thus, the image recording medium 11 shown in FIG. 3 can be used in a manner similar to the image recording medium 1 shown in FIG. 1.

In the image recording medium 1 or 11 shown in FIG. 1 or 3, deformation of the configuration of the image recording medium makes it possible for a user to identify the front side thereof coated with the developing agent.

Figure 4:
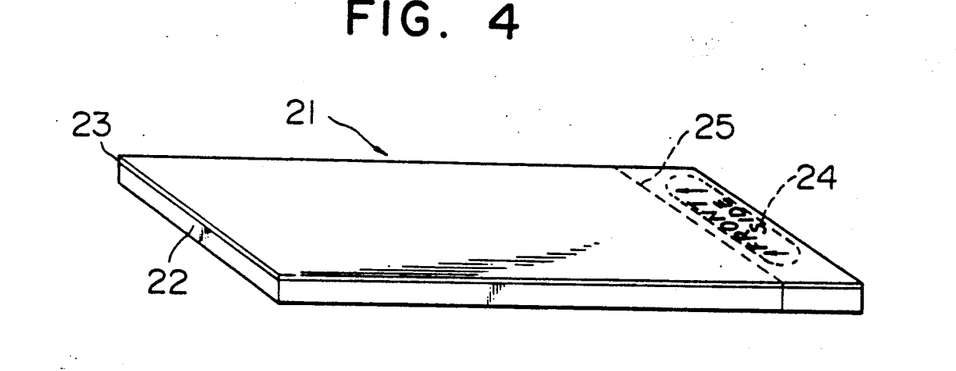
FIG. 4 is a view similar to FIG. 1, but showing another modified image recording medium.

FIG. 4 shows another modified form of the image recording medium. In this modified image recording medium 21, an identifying index is formed by dyeing or deposition of material due to printing or the like. That is, the image recording medium 21 is composed of a substrate 22 and developing agent 23 coated on one side of the substrate 22. Dyeing or printing 24 is applied to an end edge portion of the image recording medium 21, in order to indicate the front side thereof coated with the developing agent 23. Perforation 25 is formed along the end edge portion of the image recording medium 21 having carried thereon the dyeing or printing 24. After an image is developed onto the image recording medium 21, the end edge portion carried thereon the dyeing or printing 24 is severed from the body of the image recording medium 21 along the perforation 25, whereby there can be provided a sheet which has carried thereon the developed image, but which has no portion having carried thereon the dyeing or printing 24.

Figure 5:
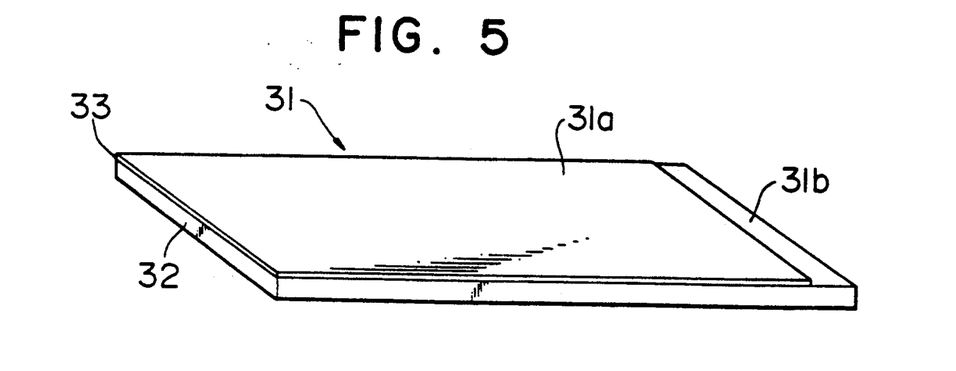
FIG. 5 is a view similar to FIG. 1, but showing still another modified image recording medium.

FIG. 5 shows still another modified form of the image recording medium. The image recording medium 31 is composed of a substrate 32 and developing agent 33 coated on one side of the substrate 32. As will be seen from FIG. 5, the developing agent 33 is not coated on the entire surface of the one side of the substrate 32, but an end edge portion of the substrate 32 is not coated with the developing agent 33. That is, the image recording medium 31 has a body 31a having carried thereon the developing agent 33 and an end edge portion 31b on which the developing agent 33 is not carried. A user touches the body 31a and the end edge portion 31b with his fingers and senses a step at the boundary between the body 31a and the end edge portion 31b or a difference in friction between them, whereby the user can identify the front side of the image recording medium 31 coated with the developing agent 33.

Alternatively, the back side of the image recording medium may be subjected to glossy treatment or to surface treatment due to fluorescent dye. In this case, the glossy surface or the fluorescent surface serves as an identifying index indicative of the front and back sides of the image recording medium.

Further alternatively, it may be considered that at preparation of the image recording medium, powder of quartz, boric acid or the like is mixed with the binder such as polyvinyl alcohol or the like. By doing so, the powder of quartz or boric acid is dispersed substantially at uniform density on the side of the image recording medium coated with the developing agent. This makes it possible to identify the front and back sides of the image recording medium with the user's eyes. In this case, the quartz or boric acid serves as an identifying index.

Furthermore, if the substrate has a sufficient thickness, a part of one side surface of the substrate, which is located at a predetermined position, may be colored to serve as an identifying index. Alternatively, it may also be considered that a mechanism employed in preparation of braille type or the like is used to form projections on the front side of the image recording medium. The projections, of course, serve as an identifying index.

The developing agent for the image recording medium can utilize any types of developing agent employed in the conventional photo and pressure sensitive recording media. For instance, inorganic acid material such as activated clay, kaolin or the like, phenolic compound, aromatic carboxylic compound such as salicylic acid, gallic acid, propyl-tannic acid or the like may be used alone or in combination. Further, binder, filler, adhesive and the like can be mixed with the developing agent at any optional ratio. The substrate includes paper, plastic film, gelatin film, metallic foil or the like. The plastic film is formed of, for example, polyethylene, polypropylene, polyvinyl chloride, polyvinylidene chloride or polyester.

As described above, the front and back sides of the image recording medium illustrated in FIG. 1, 3, 4 or 5 can easily be identified by the index. Thus, it is prevented that a general user mistakes the front and back sides of the image recording medium when the same is inserted in the image recording apparatus, making it possible to ensure that an image is formed on the front side of the image recording medium coated with the developing agent.

Figure 6:
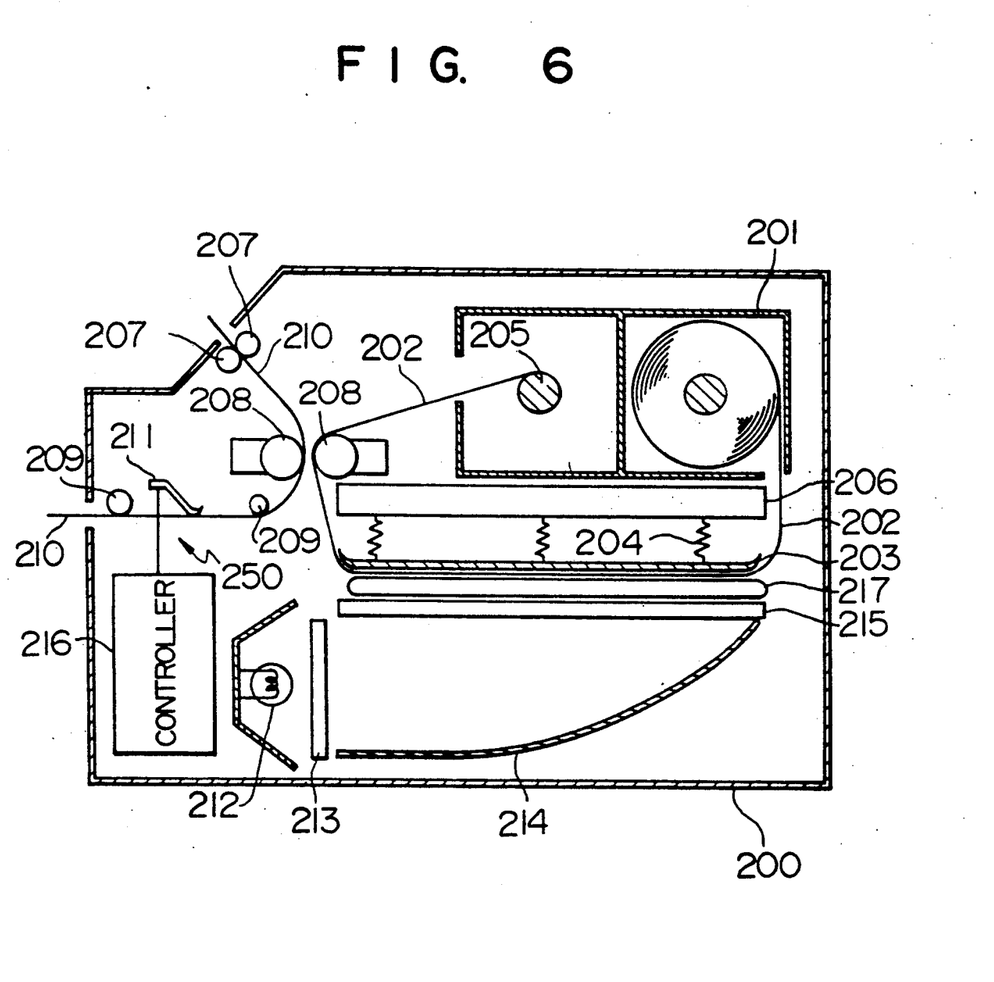
FIG. 6 is a schematic cross-sectional view of an image recording apparatus having incorporated therein a detecting device embodying the invention.

Referring next to FIG. 6, there is shown an image recording apparatus in which a detecting device embodying the invention is incorporated for identifying a sheet-like image recording medium 210. The apparatus is of type which utilizes the previously mentioned color-compatible photo and pressure sensitive recording medium material disclosed in U.S. Pat. No. 4,399,209. The apparatus comprises a body 200. A light source 212 is arranged at a lower location within the body 200. A color correction filter 213 is arranged on the right of the light source 212. Arranged on the right of the filter 213 is a light diffusion plate 214 above which a glass platen 215 is arranged. A stationary frame 206 is arranged above the platen 215. A cassette 201 is fixedly mounted above the stationary frame 206. A continuous roll of photo and pressure sensitive web 202 is accommodated in a right-hand compartment of the cassette 201. A take-up roller 205 is arranged within a left-hand compartment of the cassette 201. A contact plate 203 is arranged between the stationary frame 206 and the platen 215, and is suspended from the stationary frame 206 through a plurality of springs 204 for movement toward and away from the platen 215. An original frame 217 capable of accommodating therein an original having carried thereon image information is arranged between the pressure plate 203 and the platen 215 for movement horizontally. A pair of pressure-fixing rollers 208 and 208 are arranged on the left of the stationary frame 206. A pair of heat-fixing rollers 207 and 207 are arranged above the pressure-fixing rollers 208 and 208. Arranged on the left of the pair of pressure-fixing rollers 208 and 208 are two pairs of feed rollers 209 (see FIG. 7) for feeding a sheet-like image recording medium 210.

Figure 7:
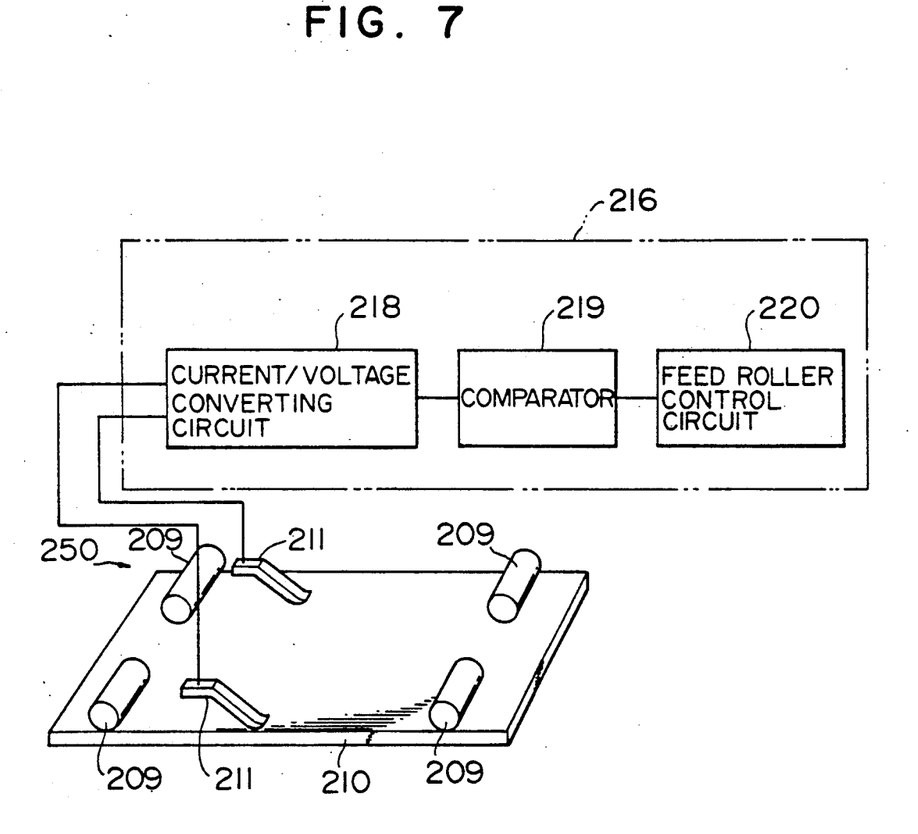
FIG. 7 is a fragmentary perspective view of the detecting device illustrated in FIG. 6, with a controller shown in a block diagram.

A detecting device 250 is arranged between the two pairs of feed rollers 209. The detecting device 250 comprises a pair of measuring electrodes 211 and 211 and a controller 216 connected to the electrodes 211 and 211, as clearly shown in FIG. 7. In view of a difference in electric conductivity between front and back sides of the image recording medium 210, the pair of measuring electrodes 211 and 211 sense which one of the front and back sides of the image recording medium 210 is in contact with the electrodes 211 and 211 on the basis of a threshold value which is an intermediate value between the electric conductivity of the front side of the image recording medium 210 and the electric conductivity of the back side thereof, thereby detecting whether or not the image recording medium 210 is set correctly. Theoretically, the electrodes 211 and 211 may be in contact with either of the front and back sides of the image recording medium 210. It is preferable, however, that the electrodes 211 and 211 are in contact with the back side of the image recording medium 210 as illustrated in FIGS. 6 and 7, in order to prevent the electrodes 211 and 211 from marring the front side of the image recording medium 210 which is coated with mixture of developing agent and electro-conductive material. The mixture ratio of the electro-conductive material is so set that the conductivity of the front side of the image recording medium 210 takes a value in compliance with the type of the image recording medium 210. The mixture of the electro-conductive material and the developing agent serves as electrical resistance material.

The detecting device 250 for identifying the front and back sides of the image recording medium 210 will next be described with reference to FIG. 7. The pair of electrodes 211 and 211 arranged in contact with the image recording medium 210 at insertion thereof in the body 200 (see FIG. 6) are electrically connected to the controller 216. The controller 216 includes a current/voltage converting circuit 218, a comparator 219 and a roller control circuit 220 for controlling rotation of the feed rollers 209.

The operation of the image recording apparatus constructed as above will be described with reference to FIGS. 6 and 7.

The original having carried thereon image information is set in the original frame 217 on the outside of the body 200. The original frame 217 is then inserted in the body 200 to a predetermined position between the contact plate 203 and the platen 215. Subsequently, the contact plate 203 is moved downwardly to urge a portion of the web 202 and the original frame 217 against the platen 215. The light source 212 is then switched on. Light emitted from the light source 212 passes through the color correction filter 213 and is diffusedly reflected by the diffusion plate 214. The light from the diffusion plate 214 is transmitted through the original set in the original frame 217, and exposes the portion of the web 202, thereby forming a latent image corresponding to the image information on the original, onto the portion of the web 202. After completion of the exposure, a moving unit (not shown) is driven to move the contact plate 203 upwardly to release the close contact between the web 202 and the original frame 217. Subsequently, the image recording medium 210 is inserted in the body 200 through an opening in the left-hand side wall thereof. The feed rollers 209 feed the image recording medium 210 until the latter is brought into contact with the electrodes 211 and 211. An amount of electric current flowing between the electrodes 211 and 211 is converted into an amount of voltage by the current/voltage converting circuit 218. The amount of voltage is compared with a reference value by the comparator 219. The reference value in the comparator 219 is set to the aforesaid intermediate value between the conductivity of the front side of the image recording medium coated with the electric resistance material and the conductivity of the back side of the image recording medium 210 coated with no electric resistance material. In this manner, the front and back sides of the image recording medium 210 are identified. Motion of the feed rollers 209 is determined on the basis of the identification results. That is, only when the identification results indicate that the image recording medium 210 is inserted in the body 200 with the front side of the image recording medium 210 facing correctly, the feed roller control circuit 220 rotatively drives the feed rollers 209 to feed the image recording medium 210 toward the pressure-fixing rollers 208 and 208. The thus fed image recording medium 210 is superimposed upon the portion of the web 202 having carried thereon the latent image. The superimposed web and image recording medium 202 and 210 are caused to pass through the nip between the pressure-fixing rollers 208 and 208 to transfer the latent image on the portion of the web 202 onto the image recording medium 210. Subsequently, only the image recording medium 210 is caused to pass through the nip between the heat-fixing rollers 207, thereby bringing color development to a good condition. The developed image recording medium 210 is then discharged out of the body 200. On the other hand, the portion of the web 202 is wound around the take-up roller 205.

Although the detecting device 250 has been described as having the pair of electrodes 211 and 211, the detecting device 250 may have two or more pairs of electrodes. In this case, the size of the image recording medium 202, as well as the front and back sides thereof, can also be identified by the electrodes. Further, the mixing ratio of the electro-conductive material mixed with the developing agent may vary depending upon the type or kind of the substrate or the developing agent of the image recording medium 210. In this case, the output signal from the current/voltage converting circuit 218 is sent to an A/D converter where the output signal is converted into multi-value digital information. The digital information is compared with digital values corresponding respectively to the kinds of the substrate and the image agent. By doing so, the kind of the substrate and the kind of the developing agent can be identified. Moreover, the electric resistance material may be coated with at least a part of the back side of the image recording medium 210, which is opposite to the front side thereof coated with the developing agent.

As described above, the detecting device 250 illustrated in FIGS. 6 and 7 comprises the electrodes 211 for measuring the conductivity of the image recording medium 210 coated with the electric resistance material, and means for identifying the image recording medium 210 on the basis of the measured conductivity. Thus, it is possible for the detecting device 250 to identify the image recording medium 210 without marring the appearance of the image recording medium 210.

Figure 8:
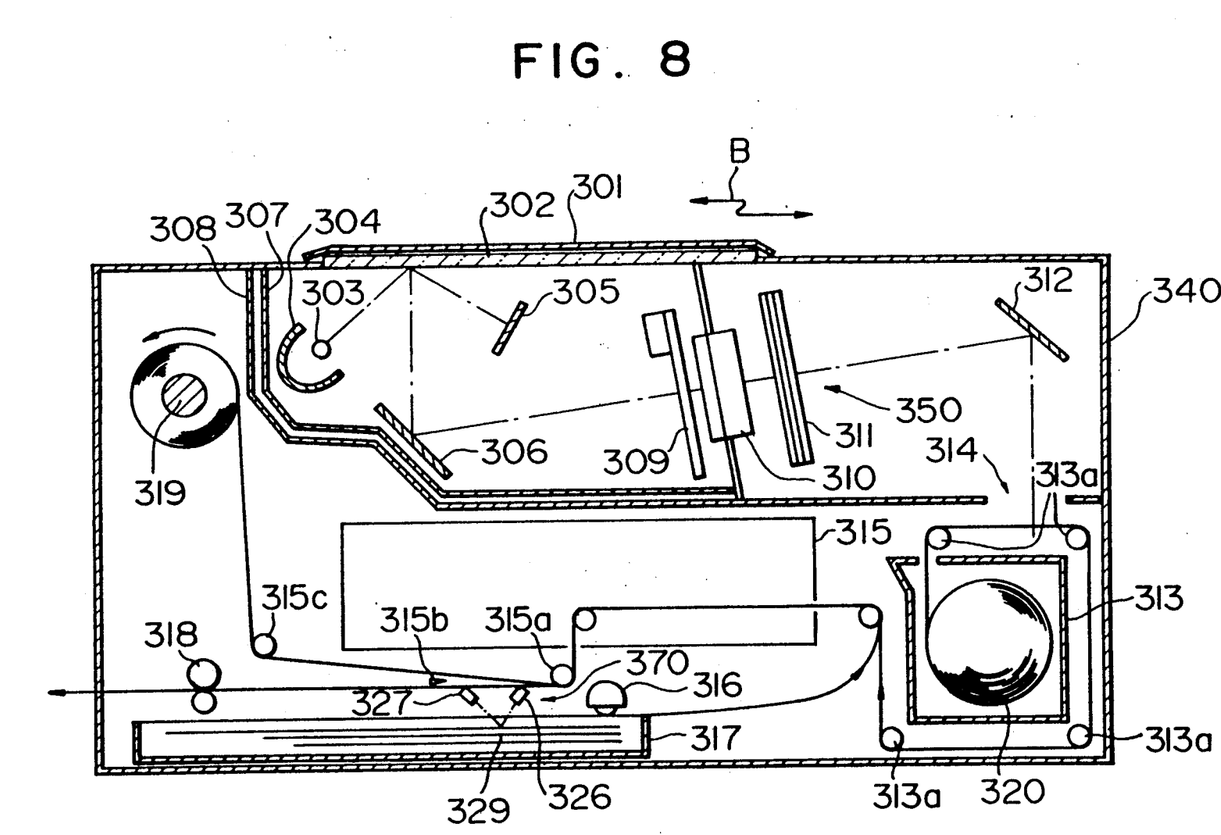
FIG. 8 is a schematic cross-sectional view of an image recording apparatus having incorporated therein a modified detecting device.

Referring next to FIG. 8, there is shown an image recording apparatus or a copying machine having incorporated therein a modified form of the detecting device. The image recording apparatus is of type which utilizes the previously mentioned color-compatible photo and pressure sensitive recording medium material disclosed in U.S. Pat. No. 4,399,209.

The image recording apparatus illustrated in FIG. 8 comprises a body 340. A transparent glass platen 302 is mounted to the top of the body 340 and can be covered with a platen cover 301. An original can be set between the platen 302 and the platen cover 301 in such a manner that a side of the original having carried thereon image information faces downwardly. At exposure subsequently to be described, the platen 302 as well as the platen cover 301 is reciprocatively moved together with the original by a moving mechanism (not shown) in a direction indicated by an arrow B in FIG. 8.

An exposure unit 350 includes a light source 303 for emitting light with which the original is illuminated. The light source 303 is arranged below the platen 302 and at an upper location within the body 340. A cold mirror 304 is arranged at a location on the rear and left of the light source 303. The light source 303 shines upon a predetermined line on the information side of the original. The predetermined line extends horizontally and perpendicularly to the arrowed direction B. Heat waves emitted from the light source 303 are transmitted through the cold mirror 304, while visible radiation from the light source 303 is reflected forwardly by the cold mirror 304. Thus, when the plate 302 as well as the platen cover 301 is moved in the arrowed direction B, the information side of the original passes successively over the predetermined line illuminated with the light from the light source 303.

An optical system includes a reflecting mirror 305 arranged at a location on the right of the light source 303. The reflecting mirror 305 reflects a part of the light emitted from the light source 303, which is not directed toward the original, to cause the reflected light part to shine upon the predetermined line on the information side of the original. Below the predetermined line, a reflecting mirror 306 is arranged for directing the light reflected by the predetermined line, toward the right within the body 340. At a location on the right of the reflecting mirror 306, a shutter 309 is arranged for intercepting or passing the light reflected by the reflecting mirror 306.

A lens system 310 is arranged on the right of the shutter 309. On the right of the lens system 310, a filter 311 is arranged for permitting light components for respective cyan, magenta and yellow to be transmitted selectively through the filter 311. At a right upper location within the body 340, a reflecting mirror 312 is arranged for reflecting downwardly the light having passed through the filter 311. Below the reflecting mirror 312, an exposure station 314 is arranged for exposing a portion of a continuous web 320 to the light reflected by the reflecting mirror 312. The web 320 is coated with microcapsules each containing dye precursor. Below the exposure station 314, a cartridge or Patrone 313 is arranged for accommodating therein an unused portion of the continuous web 320 wound into a roll. A plurality of web feed rollers 313a are arranged around the web cartridge 313 for feeding the web 320. A drive motor (not shown) is operatively connected to the web feed rollers 313a to transport the web 320 in synchronism with the movement of the platen 302. The web 320 is transported around the cartridge 313 by the drive motor and the web feed rollers 313a, and is conveyed to a pressure developing unit 315 which is arranged on the left of the cartridge 313. Since the original moves together with the platen 302 in synchronism with transportation of the web 320, a latent image corresponding to the image information on the original is formed onto the portion of the web 320 at the exposure station 314.

Below the pressure developing unit 315, a sheet cartridge 317 is arranged which accommodates therein a stack of image recording media 329 of cut sheet type. Each image recording medium 329 has a front side thereof coated with developing agent. The bottom of the inner surface of the cartridge 317 is black in color. Above the sheet cartridge 317, a roller 316 is arranged for drawing the image recording media 329 one by one out of the sheet cartridge 317. The drawn image recording medium 329 is fed by the roller 316 toward the web cartridge 313. The image recording medium 329 is brought into close contact with the portion of the web 320 having carried thereon the latent image. That is, the image recording medium 329 and the web 320 are superimposed one upon the other and are transported toward the pressure developing unit 315 for developing the latent image on the portion of the web 320, onto the image recording medium 329.

Figure 9:
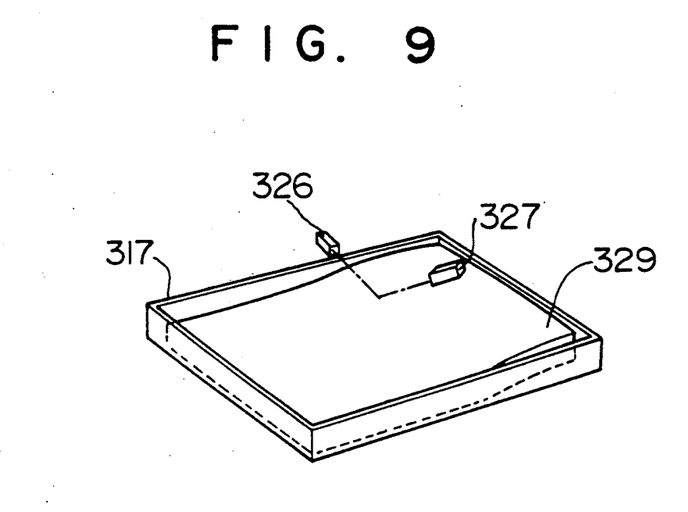
FIG. 9 is a perspective view of a sheet cartridge, and a light emitter and a light receiver of the detecting device illustrated in FIG. 8.
Figure 10:
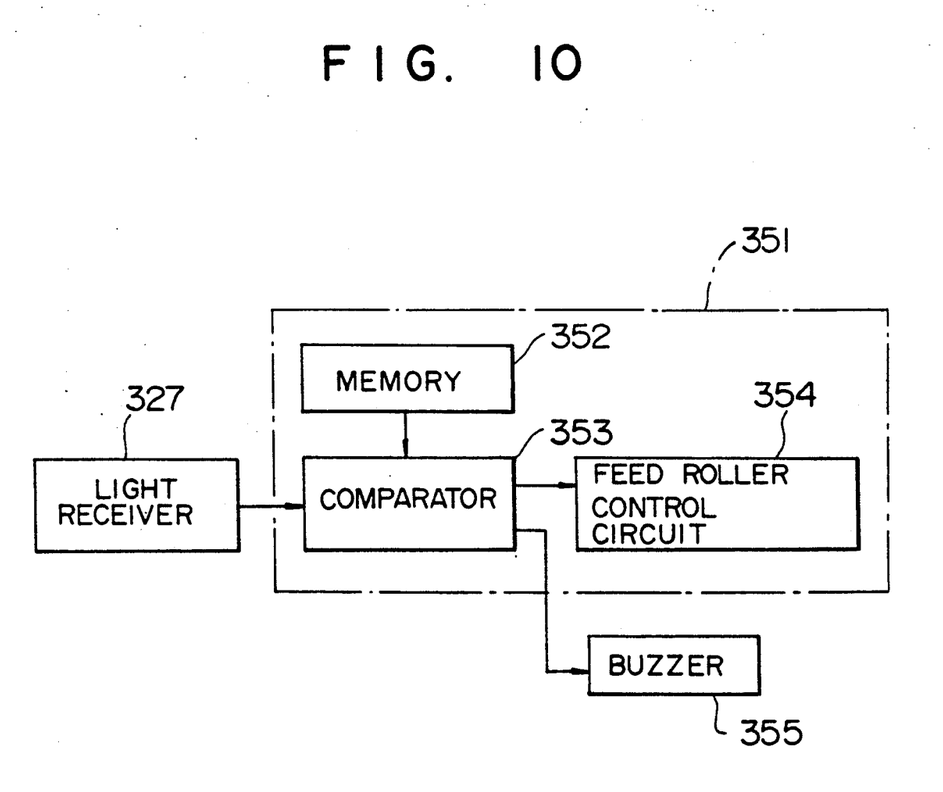
FIG. 10 is a block diagram showing a controller connected to the light receiver illustrated in FIGS. 8 and 9.

A detecting device 370 is arranged above the sheet cartridge 317 as shown in FIGS. 8 and 9. The detecting device 370 comprises a light emitter 326 emitting light toward the back side of the image recording medium 329 on the top of the stack within the sheet cartridge 317, and a light receiver 327 for receiving light reflected from the image recording medium 329. The light receiver 327 is connected to a controller 351 as shown in FIG. 10. The controller 351 has a memory 352 having stored therein a first threshold value for use in identification of presence and absence of the image recording media 329 within the sheet cartridge 317 and a second threshold value for use in identification of the front and back sides of the image recording medium 329. A comparator 353 compares a light quantity and/or wavelength of the light received by the light receiver 327 with the first and second threshold values to identify the presence and absence and the front and back sides of the image recording medium 329. The first and second threshold values are determined on the basis of previous or preliminary statistical researches. When the image recording media 329 within the sheet cartridge 317 run out, the light from the light emitter 326 is reflected from the black bottom of the sheet cartridge 317 so that the light quantity of the light received by the light receiver 327 is reduced considerably, or the wavelength of the light received by the light receiver 327 is varied. The first threshold value is used for sensing the reduction in light quantity and/or the variation in wavelength. On the other hand, the second threshold value is used for detecting distinction in reflectivity between the front and back sides of the image recording medium 329. If it is identified that the image recording medium 329 is set properly in the sheet cassette 317, a signal is sent to a feed roller control circuit 354 to control the roller 316 so as to feed the image recording medium 329 out of the sheet cassette 317. Otherwise, a signal is sent to a buzzer 355 to sound the same.

The superimposed web and image recording medium 320 and 329 are transported downwardly out of the pressure developing unit 315, and are changed in direction to the left by a guide roller 315a. The web and image recording medium 320 and 329 are then separated from each other by a separator 315b arranged on the left of the guide roller 315a. The web 320 is transported upwardly by a guide roller 315c arranged on the left of the separator 315b, so that the used portion of the web 320 is wound around a take-up roller 319 arranged at a left upper location within the body 340. On the other hand, the separated image recording medium 329 is transported to the left along a sheet guide (not shown). On the left of the separator 315b, a heat-fixing unit 318 is arranged for giving a gloss to the developed image formed on the image recording medium 329. The image recording medium 329 having passed through the heat-fixing unit 318 is discharged out of the body 340.

The operation of the image recording apparatus illustrated in FIGS. 8 through 10 will next be described.

With the original stopping at an initial position, the light source 303 and the reflecting mirror 305 shine upon the predetermined line on the original. Light reflected from the original is directed toward the right by the reflecting mirror 306, and is passed through the shutter 309, the lens system 310 and the filter 311. The light is then reflected downwardly by the reflecting mirror 312, and illuminates a portion of the web 320 at the exposure station 314.

As the platen 302 and the cover 301 start to move together with the original in the arrowed direction B, the web 320 begins to be transported and moved around the web cartridge 313 by the rollers 313a. When the movement of the original is completed, a latent image corresponding to the image information on the original is formed onto the portion of the web 320. The portion of the web 320 extending around the cartridge 313 is equal to or longer than the original placed upon the platen 302.

The light emitter 326 emits a spot light toward the image recording medium 329 at the top of the stack within the sheet cartridge 317. The light receiver 327 receives the light reflected from the image recording medium 329. Information on the light quantity and/or the wavelength of the light received by the light receiver 327 is sent to the controller 351. On the basis of the information, the comparator 353 compares the light quantity and/or the wavelength with the first and second threshold values stored in the memory 352, to identify the presence and absence and the front and back sides of the image recording medium 329. If the comparison indicates that the image recording media 329 run out, or that the front side of the image recording medium 329 coated with the developing agent does not face downwardly, the controller 351 interrupts the operation of the image recording apparatus and sounds the buzzer 355, to call upon a user to take an appropriate measure. On the other hand, the comparison indicates that the image recording medium 329 is set with the front side thereof facing downwardly, the controller 351 causes the feed roller control circuit 354 to rotate the roller 316, thereby drawing the image recording medium 329 out of the sheet cassette 317.

The portion of the web 320 having carried thereon the latent image is superimposed, in close contact relation, upon the image recording medium 329 drawn out of the sheet cartridge 317 by the feed roller 316. The superimposed web and image recording medium 320 and 329 are inserted into the pressure developing unit 315. The pressure developing unit 315 destroys unexposed microcapsules on the portion of the image recording medium 329, which are low in mechanical strength. The dye precursor squeezed out of the destroyed microcapsules is reacted with the developing agent on the image recording medium 329, thereby developing a color image onto the image recording medium 329.

The portion of the web 320 and the image recording medium 329 discharged out of the pressure developing unit 315 are changed in direction to the left by the roller 315a, and then are separated from each other by the separator 315b. The portion of the web 320 separated from the image recording medium 329 is transported upwardly and is wound around the take-up roller 319. On the other hand, the separated image recording medium 329 is transported to the left, and is passed through the heat-fixing unit 318, whereby color development of the image on the image recording medium 329 is accelerated and a gloss is given to the image. The image recording medium 329 is then discharged out of the body 340.

Heat surrounding the light source 303 and the cold mirror 304 tends to be transmitted to a lower section within the body 340. In this connection, an air layer between a pair of spaced walls 307 and 308 is agitated by air delivered from a fan or a blower (not shown), so that the heat is prevented from being transmitted to the lower section. Thus, no bad influence of the heat is exerted upon the web 320 and the image recording media 329.

Figure 11:
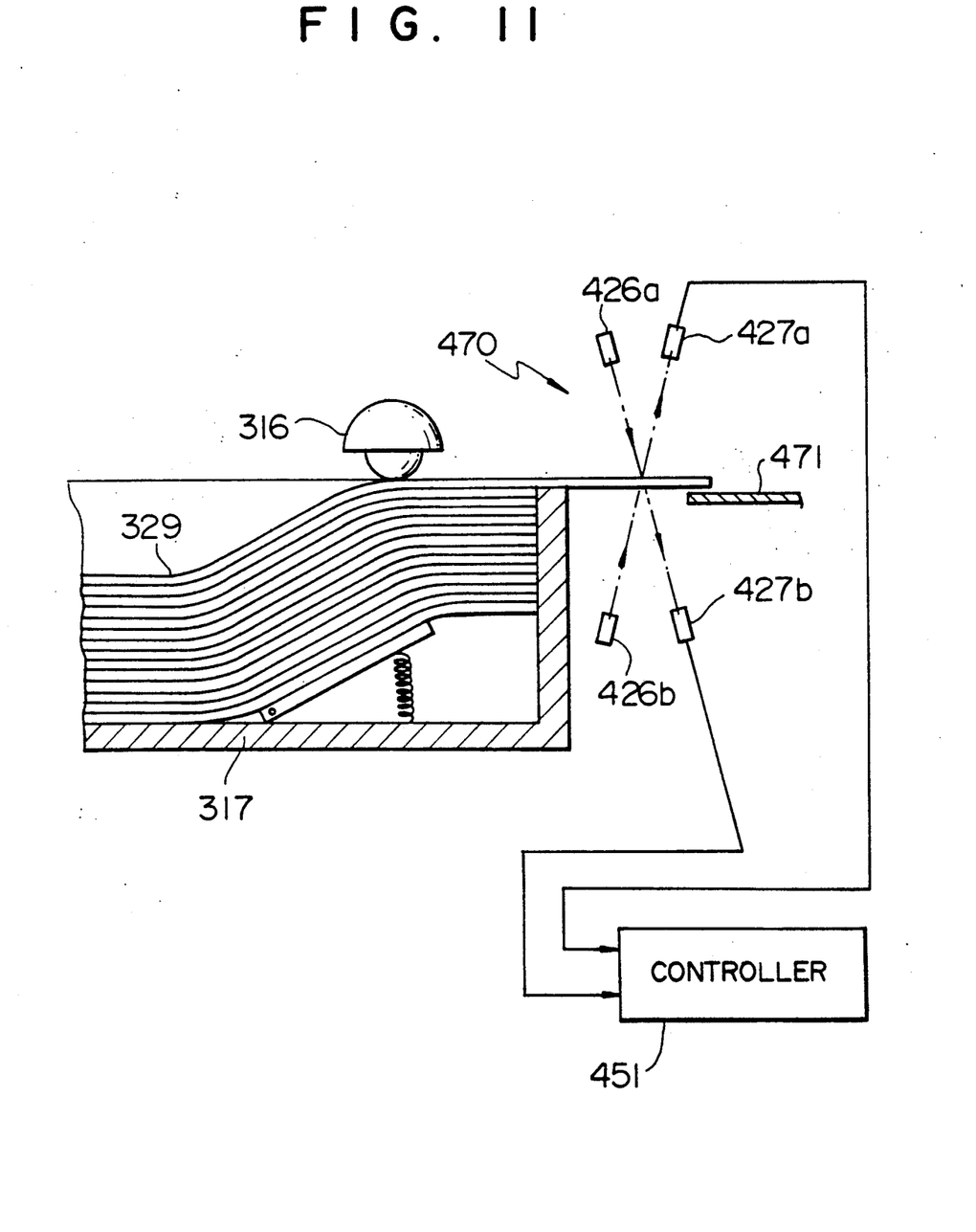
FIG. 11 is an enlarged fragmentary view of another modified detecting device.

FIG. 11 shows a modified detecting device 470 for use in the image recording apparatus illustrated in FIG. 8. The detecting device 470 comprises a first pair of light emitter and receiver 426a and 427a associated with the back side of the image recording medium 329 and a second pair of light emitter and receiver 426b and 427b associated with the front side of the image recording medium 329 coated with developing agent. The light receivers 427a and 427b are connected to a controller 451 similar to the controller 351 shown in FIG. 10. The light emitter 426a emits light toward the back side of the image recording medium 329 when the latter is fed by the feed roller 316 to a position where the leading edge of the image recording medium 329 rests on a sheet guide 471. The light receiver 427a receives light reflected from the back side of the image recording medium 329. On the other hand, the light emitter 426b emits light toward the front side of the image recording medium 329 coated with the developing agent, and the light reflected from the front side is received by the light receiver 427b. The controller 451 identifies the front and back sides of the image recording medium 329 on the basis of a difference in reflectivity between the front and back sides of the image recording medium 329.

It is needless to say that the detecting device illustrated in FIG. 9 or 11 can be applied to other image recording media such as heat-sensitive sheets and the like.

In case where the image recording medium is different in color between its front and back sides, the front and back sides are identified in relation to the aforesaid wavelength of the light reflected from the image recording medium. In this case, it may be considered to employ a color absorption filter.

Furthermore, if it is not required to identify the presence and absence and the front and back sides of the image recording medium independently of each other, the reflectivity of the bottom of the sheet cartridge 317 is so set appropriately that it can be identified on the basis of a single threshold value whether or not the image recording medium is set correctly.

As described above, it is possible for the detecting device shown in FIGS. 8 through 10 or FIG. 11 to notify the user of the fact that the image recording medium 329 is reverse in front and back sides when the image recording medium 329 is set erroneously with its front side facing upwardly. Further, the presence and absence of the image recording medium 329 can also be identified by the detecting device. Thus, it is possible to reduce the cost.

What is claimed is:

1. A detecting device for an image recording medium having front and back sides distinguishable from each other, which comprises:
   light emitting means for emitting light with which at least one of the front and back sides of the image recording medium is illuminated;
   light receiving means for receiving light reflected from the at least one side of the image recording medium; and
   control means connected to said light receiving means, for identifying the front and back sides and presence and absence of the image recording medium on the basis of the light received by said light receiving means.

2. The detecting device according to claim 1, wherein said control means identifies the front and back sides and the presence and absence of the image recording medium on the basis of at least one of a light quantity and wavelength of the light received by said light receiving means.

3. The detecting device according to claim 1, wherein the image recording medium has the front side thereof coated with developing agent.

4. The detecting device according to claim 1, wherein said light emitting means includes a pair of light emitters, one of said pair of light emitters emitting light toward the front side of the image recording medium, and the other light emitter emitting light toward the back side of the image recording medium, and wherein said light receiving means includes a pair of light receivers, one of said pair of light receivers receiving light emitted from said one light emitter and reflected from the front side of the image recording medium, and the other light receiver receiving light emitted from said other light emitter and reflected from the back side of the image recording medium.

5. An image recording apparatus utilizing a photo and pressure sensitive recording medium and an image recording medium having front and back sides distinguishable from each other, which comprises:
   original support means for supporting an original having carried thereon image information;
   exposure means including light source means for emitting light to shine upon the original, and optical means for directing the light reflected from the original, toward said photo and pressure sensitive recording medium arranged at an exposure station, to expose said photo and pressure sensitive recording medium thereby forming a latent image onto said photo and pressure sensitive recording medium, the latent image corresponding to the image information on the original;
   feed means for feeding said image recording medium to superimpose the same onto said photo and pressure sensitive recording medium;
   pressure developing means for pressurizing said superimposed photo and pressure sensitive recording medium and image recording medium to develop the latent image on said photo and pressure sensitive recording medium, onto said image recording medium; and
   a detecting device for the image recording medium, said detecting device including light emitting means for emitting light with which at least one of the front and back sides of the image recording medium is illuminated, light receiving means for receiving light reflected from the at least one side of the image recording medium, and control means connected to said light receiving means, for identifying the front and back sides and presence and absence of the image recording medium on the basis of the light received by said light receiving means.

6. The image recording apparatus according to claim 5, wherein said control means includes memory means having stored therein first and second threshold values, a comparator connected to said memory means and to said light receiving means, for comparing the light received by said light receiving means with said first threshold value to identify presence and absence of the image recording medium and for comparing the light received by said light receiving means with said second threshold value to identify the front and back sides of the image recording medium, to generate a signal representative of the presence and absence and the front and back sides of the image recording medium, and a control circuit connected to said comparator and to said feed means, said control circuit being operative in response to said signal from said comparator to control motion of said feed means.

7. The image recording apparatus according to claim 5, wherein said photo and pressure sensitive recording medium is formed by a continuous web coated with microcapsules each containing dye precursor.

* * * * *